United States Patent
Merrill et al.

[11] Patent Number: 5,883,010
[45] Date of Patent: Mar. 16, 1999

[54] METHOD FOR PROTECTING NONSILICIDED SURFACES FROM SILICIDE FORMATION USING SPACER OXIDE MASK

[75] Inventors: Richard B. Merrill, San Mateo; C. S. Teng, San Jose; John M. Pierce, Palo Alto, all of Calif.

[73] Assignee: National Semiconductor Corporation, Santa Clara, Calif.

[21] Appl. No.: 907,353

[22] Filed: Aug. 7, 1997

[51] Int. Cl.⁶ .................................................... H01L 21/00
[52] U.S. Cl. ........................... 438/743; 438/655; 438/630
[58] Field of Search ................................... 438/721, 723, 438/743, 745, 756, 757, 630, 649, 651, 655, 664, 682

[56] References Cited

U.S. PATENT DOCUMENTS

| | | | |
|---|---|---|---|
| 4,742,025 | 5/1988 | Ohyu et al. ............................... | 437/225 |
| 5,342,798 | 8/1994 | Huang ......................................... | 437/41 |
| 5,352,631 | 10/1994 | Sitaram et al. .......................... | 437/200 |
| 5,413,969 | 5/1995 | Huang ....................................... | 437/200 |
| 5,750,438 | 5/1998 | Hsue et al. ............................ | 438/720 X |

*Primary Examiner*—William Powell
*Attorney, Agent, or Firm*—Limbach & Limbach L.L.P.

[57] ABSTRACT

Problems forming silicided and nonsilicided structures on the same silicon substrate are overcome utilizing a spacer oxide masking technique. A protective spacer oxide layer is deposited over the entire silicon substrate surface, and a silicide exclusion photoresist mask is selectively developed to permit etching of the spacer oxide layer in unmasked regions where silicides are expected to be formed. Areas of silicon substrate revealed by etching of the spacer oxide layer are exposed to silicide-forming metals, and these silicide-forming metals react with the silicon substrate to produce silicides. Spacer oxide remaining in masked regions prevents formation of silicides in those regions.

11 Claims, 4 Drawing Sheets

5,883,010

METHOD FOR PROTECTING NONSILICIDED SURFACES FROM SILICIDE FORMATION USING SPACER OXIDE MASK

BACKGROUND OF THE INVENTION

1. Field of the Invention

The present invention relates to a method of selectively forming nonsilicided and silicided semiconductor structures on the same substrate, and, more particularly, to a method of masking silicide deposition utilizing a spacer oxide layer to prevent exposure to silicide-forming metals, thereby restricting silicide formation to unmasked surfaces.

2. Description of the Related Art

With the increased density of semiconductor devices, sheet resistivity of electrically-conducting structures of these devices, such as the gate, drain and source regions of MOS transistors, the emitters of bipolar transistors, the local interconnect regions of MOS and bipolar transistors, and the interconnect lines connecting these devices together, is beginning to limit the speed at which semiconductor devices can operate.

One well-known technique for reducing the sheet resistivity of silicon structures is to form a layer of metal silicide over the surface of silicon. The resulting silicided structures provide the lower resistivity of a metal silicide, along with the well-known attributes of silicon.

While silicides are extremely useful for enhancing the function of digital circuits, formation of silicides can interfere with the operation of analog circuits. Introduction of metal silicides into analog circuits can degrade signal integrity and aggravate circuit stress, VT offset, drift, and junction leakage.

Moreover, because silicided regions have such low sheet resistances, they are not useful to form resistors having smaller surface areas. This limitation is particularly problematic in analog circuits, where resistors are essential circuit elements.

Because of the above described fabrication limitations, it is desirable to selectively protect analog circuit structures from exposure to silicide-forming metals, where both digital and analog circuits are fabricated on the same substrate.

SUMMARY OF THE INVENTION

The present invention provides a method for forming silicided and nonsilicided structures on the same silicon surface by utilizing a spacer oxide masking technique. Specifically, a spacer oxide layer is deposited over the entire silicon surface. A silicide exclusion photoresist mask is then developed over selected regions of the spacer oxide layer, thereby defining regions to be protected from silicide formation. Subsequent etching of the spacer oxide layer in unmasked regions reveals the underlying silicon substrate in those unmasked regions. The underlying silicon in unmasked regions is then exposed to concentrated implantation of a conductivity-altering impurity, such as n type or p type ions, and is also exposed to silicide-forming metals.

A better understanding of the features and advantages of the present invention will be obtained by reference to the following detailed descriptions and accompanying drawings which set forth embodiments in which the principles of the invention are utilized.

DETAILED DESCRIPTION

FIG. 1 shows cross-sectional drawings illustrating the process steps for protecting transistors from silicide formation utilizing the spacer oxide silicide mask. FIG. 1A shows precursor semiconductor device 110 having lightly doped P type silicon substrate 111 supporting polysilicon gate structures 112 and gate oxides 113.

Figure 1A:
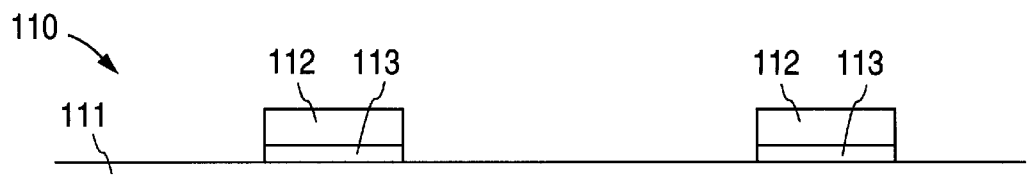
FIGS. 1A–1H are cross-sectional drawings illustrating fabrication of silicided and nonsilicided MOS transistors on the same silicon surface utilizing a spacer oxide masking technique in accordance with the present invention.
Figure 1B:
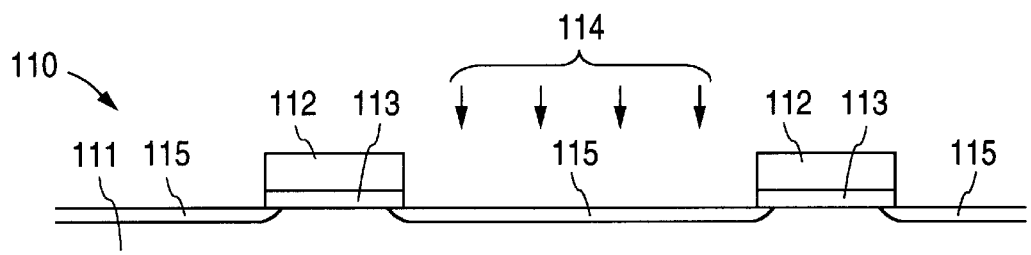
Figure 1C:
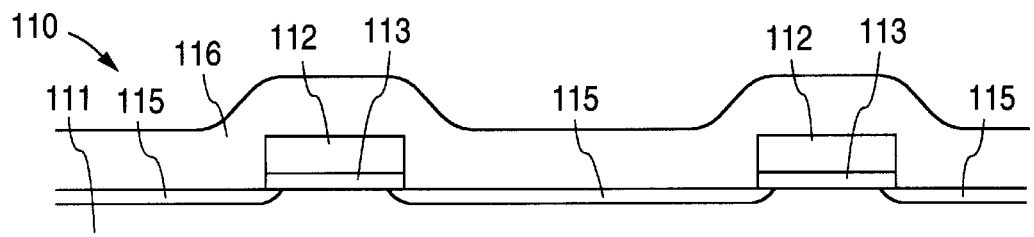

FIG. 1B shows implantation of N type impurity 114 into lightly doped P type silicon substrate 111 forming nldd regions 115. FIG. 1C shows deposition of spacer oxide layer 116 over the entire surface of precursor semiconductor device 110.

Figure 1D:
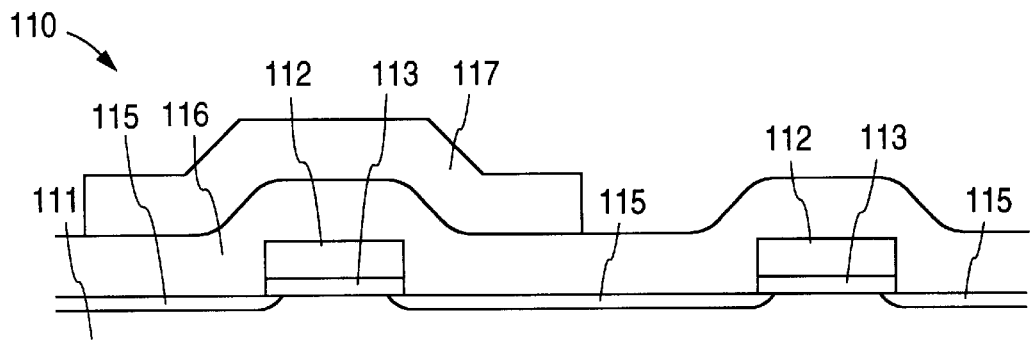
Figure 1E:
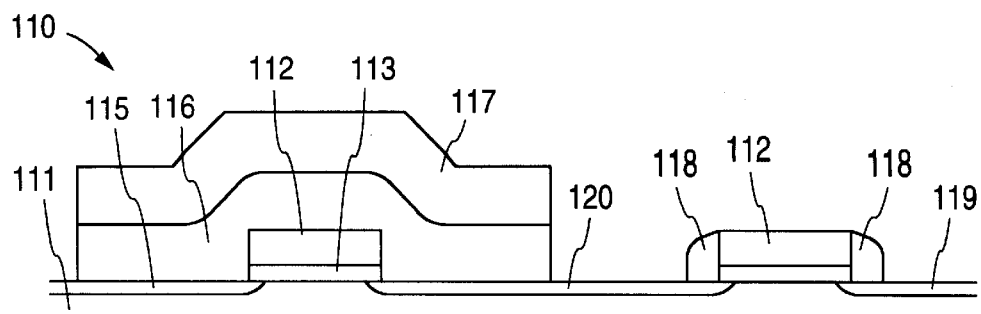

FIG. 1D shows selective formation of silicide exclusion photoresist mask 117 over regions of precursor semiconductor device 110 sought to be protected from silicide formation. FIG. 1E shows subsequent spacer etchback, wherein regions of spacer oxide layer 116 unprotected by silicide exclusion photoresist mask 117 are removed, creating gate oxide spacers 118, and revealing polysilicon gate 112 and precursor source/drain regions 119.

Figure 1F:
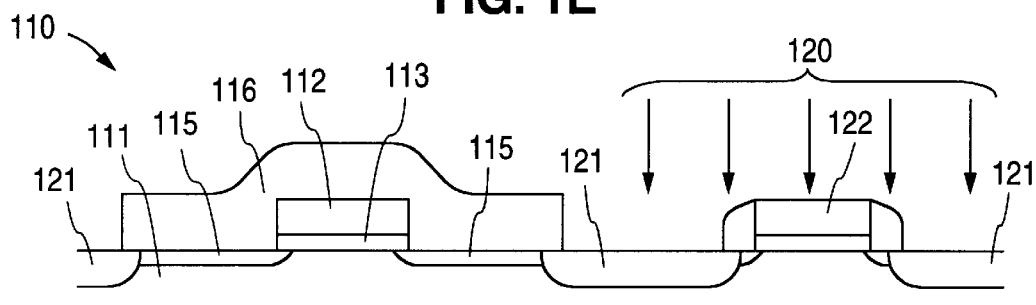
Figure 1G:
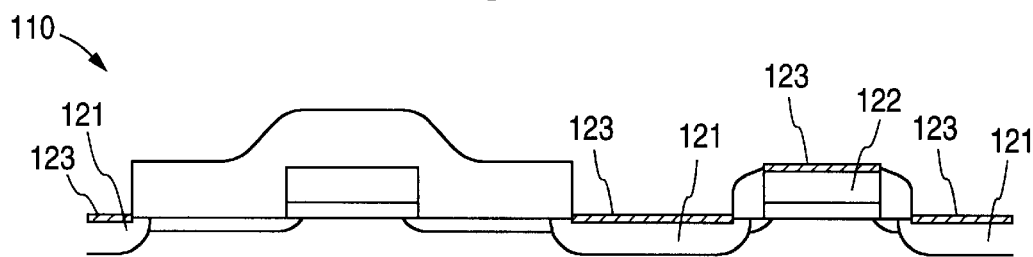

FIG. 1F shows concentrated implantation of N type impurity 120 into precursor source/drain regions 119 and gate 112, forming heavily doped N type source/drain regions 121 and gate 122. FIG. 1G shows selective formation of silicide metal layers 123 upon exposed silicon surfaces of gate 122, and N+ source/drain regions 121.

Figure 1H:
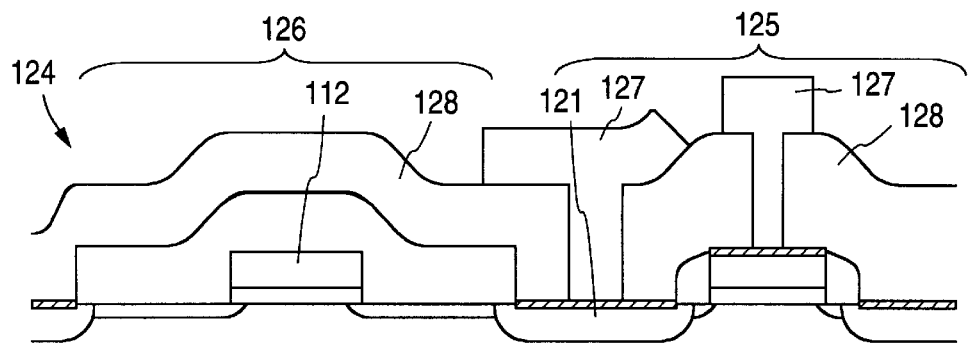

FIG. 1H shows completed MOS transistor structure 124 having silicided MOS transistor 125 and nonsilicided MOS transistor 126. Completed MOS transistor structure 124 has metal contacts 127 connected to silicided gate 122, and silicided N+ drain/source regions 121. The metal contact for nonsilicided gate 112 is not shown because it is obscured by the gate itself in this cross-sectional view. These metal contacts 127 are separated from the other structures of semiconductor structure 124 by non-conducting layer 128.

In reviewing FIG. 1H, it is important to note that nonsilicided transistor 126 has gate, drain, and source regions consisting of only lightly doped N type impurities. This causes nonsilicided transistor 126 to have higher resistance than silicided transistor 125.

However, this increased resistance does not detrimentally affect performance of nonsilicided transistor 126, as in analog circuit applications, low resistance is far less important than signal integrity. Because silicided N+ source/drain region 121 remains sufficiently distant from nonsilicided gate 112 of nonsilicided transistor 126 to minimize any signal degradation, the signal integrity of nonsilicided transistor 126 remains unaffected.

As illustrated by FIG. 1, the spacer protect masking process of the present invention requires only a single extra photoresist masking step (shown in FIG. 1D) prior to the conventional spacer oxide etching step (shown in FIG. 1E). The addition of only a single extra process step renders the current invention both efficient and cost effective.

The spacer oxide masking process in accordance with the present invention may also be employed to resolve problems associated with fabrication of resistors. FIG. 2 illustrates this alternative embodiment, wherein the spacer oxide masking process is used to create a diffused nldd resistor.

Figure 2A:
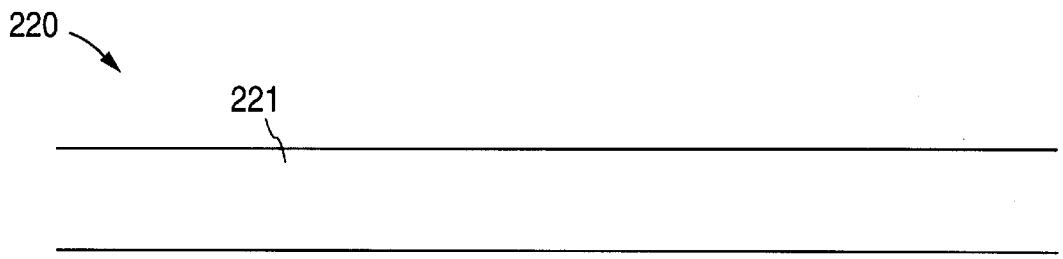
FIGS. 2A–2H are cross-sectional drawings illustrating creation of a diffused nldd resistor having silicided contact regions utilizing a spacer oxide masking technique in accordance with the present invention.
Figure 2B:
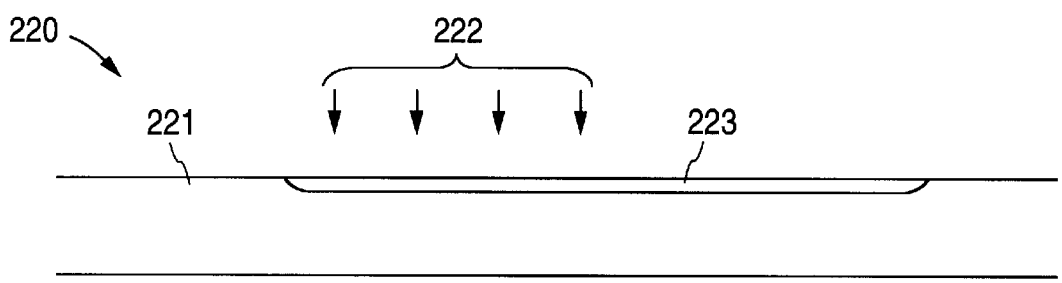

FIG. 2A shows precursor resistor structure 220 having lightly doped P type silicon substrate 221. FIG. 2B shows implantation of N type impurity 222 into lightly doped P type silicon substrate 221, forming nldd region 223.

Figure 2C:
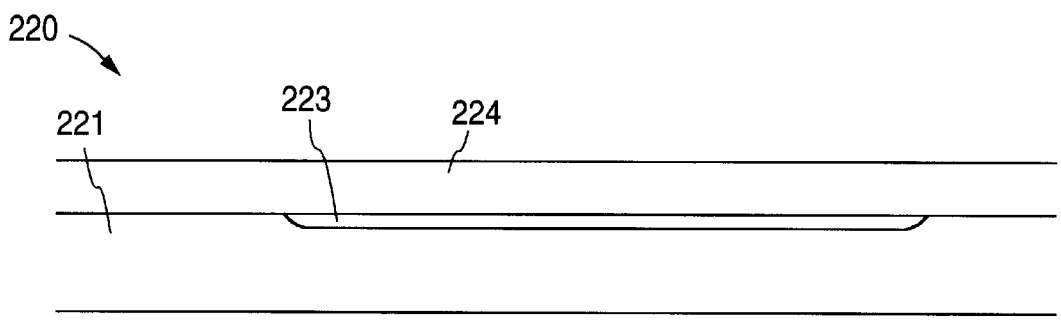
Figure 2D:
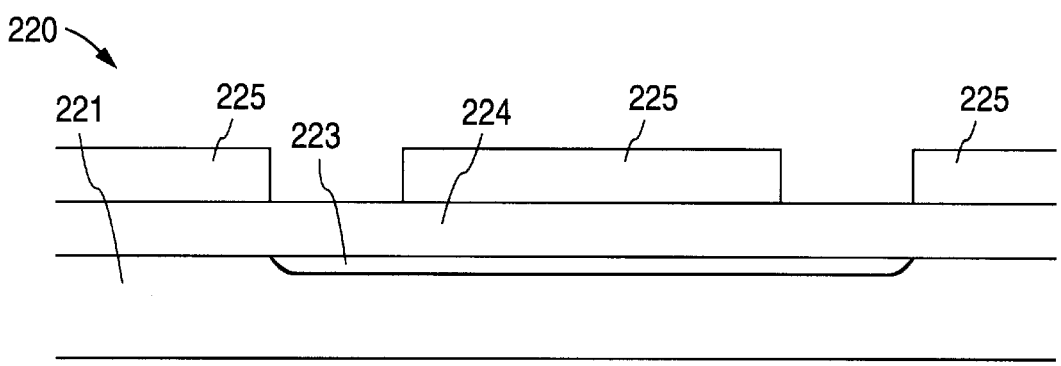

FIG. 2C shows deposition of spacer oxide layer 224 over the entire surface of precursor resistor structure 220. FIG. 2D shows selective formation of silicide exclusion photoresist mask 225 over those regions of precursor resistor structure 220 sought to be protected from silicide formation.

Figure 2E:
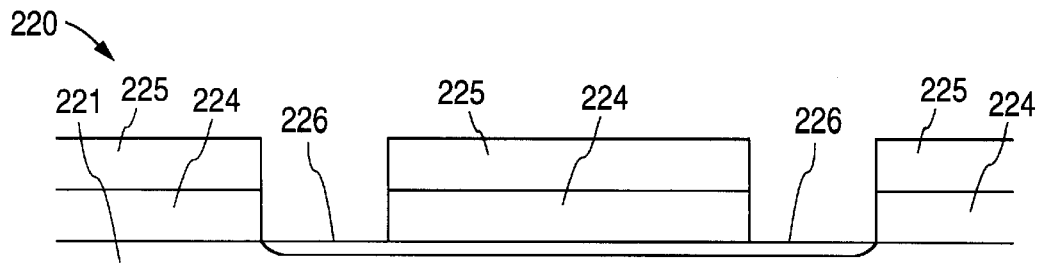
Figure 2F:
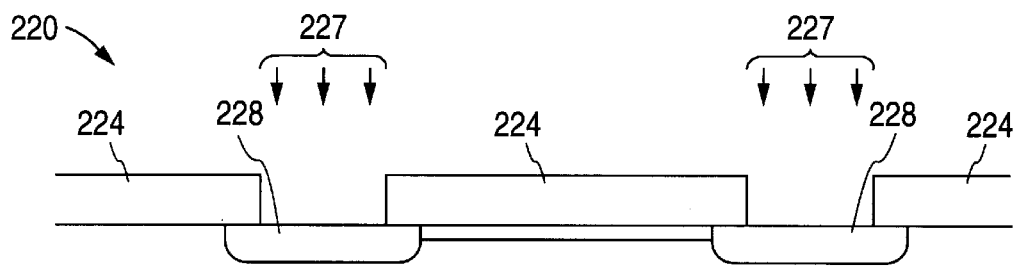

FIG. 2E shows the subsequent spacer etchback step, wherein regions of spacer oxide layer 224 unprotected by silicide exclusion photoresist mask 225 are removed, revealing precursor resistor contact regions 226. FIG. 2F shows implantation of concentrated N type impurity 227 into precursor resistor contact regions 226, forming heavily doped N+ resistor contact regions 228.

Figure 2G:
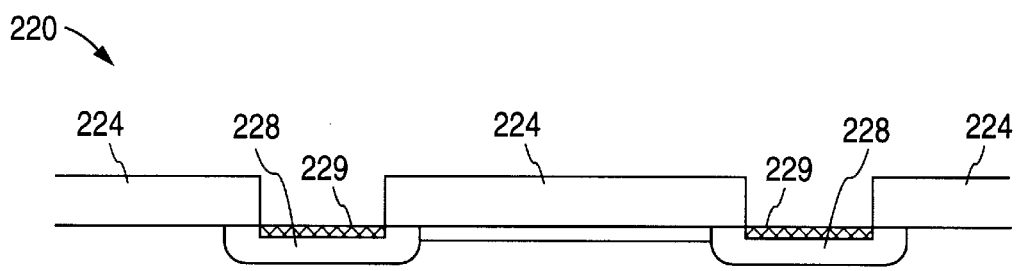
Figure 2H:
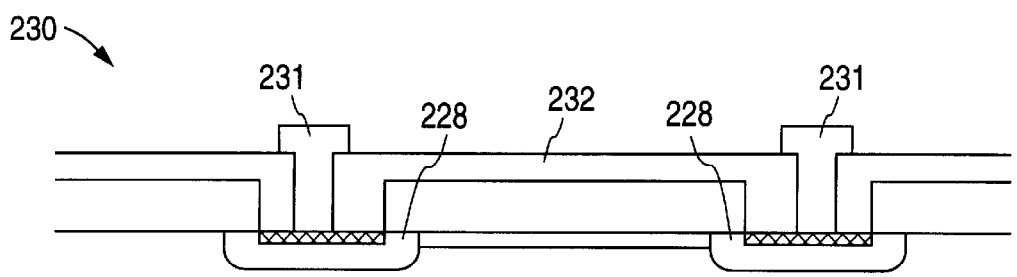

FIG. 2G shows selective formation of silicide metal layer 229 upon N+ resistor contact regions 228. FIG. 2H shows completed diffused nldd resistor structure 230 having metal contacts 231 connected to silicided N+ resistor contact regions 228. The metal contacts 231 are isolated from the remaining structures of resistor structure 230 by nonconducting layer 232.

It is important to note that silicided and nonsilicided MOS transistors 125 and 126 shown in FIG. 1H, and diffused nldd resistor 230 shown in FIG. 2H, represent specific embodiments of structures suitable for fabrication in accordance with the process of the present invention. PMOS transistors, bipolar transistors, capacitors, poly resistors, pldd diffused resistors, and even pixel cell structures, may also be created utilizing the spacer oxide masking process in accordance with the current invention. Therefore, it is intended that the following claims define the scope of the invention, and that methods and structures within the scope of these claims and their equivalents be covered thereby.

What is claimed is:

1. A method for forming suicides upon selected regions of a silicon substrate, comprising the steps of:
   depositing a spacer oxide layer over the silicon substrate;
   developing a silicide exclusion photoresist mask upon selected regions of the spacer oxide layer;
   etching the spacer oxide layer from unmasked regions, thereby exposing the silicon substrate underlying the unmasked regions;
   introducing silicide-forming metal to the exposed silicon substrate, such that a silicide-forming metal layer forms upon the exposed silicon substrate; and
   causing a reaction between the silicide-forming metal layer and the exposed silicon substrate such that silicides are formed.

2. A method for forming silicides in accordance with claim 1, wherein the method further comprises:
   implanting conductivity-altering impurity into first selected regions of the silicon substrate prior to deposition of the spacer oxide layer, such that the first selected regions are coextensive with the unmasked regions.

3. A method for forming silicides in accordance with claim 2, wherein the method further comprises:
   implanting conductivity-altering impurity into unmasked regions of the silicon substrate prior to exposing the silicon substrate to a silicide-forming metal.

4. A method for forming silicides in accordance with claim 3, wherein the unmasked regions correspond to contact regions of a resistor.

5. A method for forming silicides in accordance with claim 3, wherein the unmasked regions correspond to gate, drain, and source regions of a MOS transistor.

6. A method for forming a MOS transistor having silicided gate, drain, and source regions within the same substrate as a MOS transistor having nonsilicided gate, drain, and source regions, comprising the steps of:
   forming polysilicon gate structures on top of a lightly doped silicon substrate;
   implanting conductivity-altering impurity into the polysilicon gate structures and into the surface of the silicon substrate;
   depositing a spacer oxide layer over the gate structures and the surface of the silicon substrate;
   developing a silicide exclusion photoresistive mask upon selected regions of the spacer oxide layer, such that unmasked regions correspond to gate, drain, and source regions expected to bear silicides;
   etching the spacer oxide layer from unmasked regions, thereby exposing the silicon substrate in unmasked regions;
   implanting concentrated conductivity-altering impurity into the exposed gate structures and silicon substrate;
   forming a layer of silicide-forming metal upon the exposed silicon substrate; and
   causing the silicide-forming metal layer and the silicon substrate to react to form silicides.

7. A method for forming a MOS transistor in accordance with claim 6, wherein the lightly doped silicon substrate is of p type, the implanted conductivity-altering impurity is of n type, and the concentrated implanted conductivity-altering impurity is of n type.

8. A method for forming a MOS transistor in accordance with claim 6, wherein the lightly doped silicon substrate is of n type, the implanted conductivity-altering impurity is of p type, and the concentrated implanted conductivity-altering impurity is of p type.

9. A method for forming a resistor having silicided contact regions, comprising the steps of:
   implanting conductivity-altering impurity into a lightly doped silicon substrate;
   depositing a spacer oxide layer over the silicon substrate;
   developing a silicide exclusion photoresistive mask upon selected regions of the spacer oxide layer, such that unmasked regions correspond to regions expected to bear suicides;
   etching the spacer oxide layer from unmasked regions, thereby exposing the silicon substrate in unmasked regions;
   implanting concentrated conductivity-altering impurity into the exposed regions of the silicon substrate;
   forming a layer of silicide-forming metal upon the exposed silicon substrate; and
   causing the silicide-forming metal layer and silicon substrate to react to form silicides.

10. A method for forming a resistor in accordance with claim 9, wherein the lightly doped silicon substrate is of p type, the implanted conductivity-altering impurity is of n type, and the concentrated implanted conductivity-altering impurity is of n type.

11. A method for forming a transistor in accordance with claim 9, wherein the lightly doped silicon substrate is of n type, the implanted conductivity-altering impurity is of p type, and the concentrated implanted conductivity-altering impurity is of p type.

* * * * *

UNITED STATES PATENT AND TRADEMARK OFFICE
CERTIFICATE OF CORRECTION

PATENT NO. : 5,883,010
DATED : March 16, 1999
INVENTOR(S) : Richard B. Merrill et al.

It is certified that error appears in the above-identified patent and that said Letters Patent is hereby corrected as shown below:

In Col. 3, line 36, delete "suicides" and replace with --silicides--.

In Col. 4, line 46, delete "suicides" and replace with --silicides--.

Signed and Sealed this

Sixth Day of July, 1999

Attest:

Q. TODD DICKINSON

*Attesting Officer*     *Acting Commissioner of Patents and Trademarks*